United States Patent [19]

Nakamura et al.

[11] Patent Number: 4,734,980
[45] Date of Patent: Apr. 5, 1988

[54] PRINTED CIRCUIT BOARD WIRING METHOD

[75] Inventors: Toru Nakamura, Zama; Mitsugu Edagawa, Hadano; Jiro Kusuhara, Hadano; Hideharu Ohtomo, Hadano, all of Japan

[73] Assignee: Hitachi, Ltd., Tokyo, Japan

[21] Appl. No.: 862,636

[22] Filed: May 13, 1986

[30] Foreign Application Priority Data

May 13, 1985 [JP] Japan ................................ 60-101089

[51] Int. Cl.$^4$ ............................................. H01K 3/10
[52] U.S. Cl. ...................................... 29/850; 174/68.5
[58] Field of Search ................ 29/846, 850; 174/68.5; 339/18 R; 324/73 PC

[56] References Cited

U.S. PATENT DOCUMENTS

| | | | |
|---|---|---|---|
| 3,078,596 | 2/1963 | Sweeton | 339/18 R |
| 3,185,897 | 5/1968 | Goodin | 339/18 R X |
| 3,447,039 | 5/1969 | Branagan | 174/68.5 X |
| 3,644,792 | 2/1972 | Fields | 174/68.5 X |
| 3,830,956 | 8/1974 | Wooton et al. | 324/73 PC X |
| 4,565,966 | 1/1986 | Burr et al. | 324/73 PC |

Primary Examiner—Howard N. Goldberg
Assistant Examiner—Carl J. Arbes
Attorney, Agent, or Firm—Antonelli, Terry & Wands

[57] ABSTRACT

A method of wiring electronic parts by a printed circuit board is provided. According to the method, electronic parts having pins arranged at intervals unmatched to a predetermined grid resolution are placed on the printed circuit board and the desired pins of the electronic parts are electrically connected by the printed circuit board. The characteristic of the method resides in that wiring pins are each provided at the same relative channel position within a unit grid portion located in the vicinity of each of the pins of the electronic parts so that the pins of the electronic parts are electrically connected to one another through the wiring pins.

4 Claims, 5 Drawing Sheets

PRINTED CIRCUIT BOARD WIRING METHOD

BACKGROUND OF THE INVENTION

The present invention relates to a printed circuit board wiring method and more particularly to such type of method that is suitable for performing an open circuit or insulation test on a printed circuit board designed by new high-density layout technology applicable for the mounting of surface devices or the use of small vias on the printed circuit board.

For example, in the case of a printed circuit board for use with small-sized main frames and terminals, it is an urgent need to improve the layout density of electronic parts for the sake of economy and reliability. To this end, new layout techniques for the mounting of surface devices and the use of small vias which can not match the conventional grid (e.g., 100 mils grid) are employed. However, the printed circuit board which is designed by these new techniques can not be tested by the conventional testing method in which the probe pins are simultaneously brought into contact with all the lands provided on a 100 mils grid.

For wiring a printed circuit board having electronic parts mounted thereon with the intervals among the pins of the parts unmatched to the above-mentioned grid resolution, the following methods used in the Integri-Test 4500 system of the KOLLMORGEN CORPORATION are known. That is, (i) a method in which two probe pins are used to check whether or not the wiring between the lands are open-circuited; and (ii) a method in which a printed circuit board is placed on a conductive flat plate through an insulating material and the capacitance between lands on the board and the plate is detected to check whether or not any insulation fault exists in the printed circuit board.

According to the above-mentioned methods, it has been possible to detect an open circuit between wiring lands arranged at a desired interval of larger than a predetermined value since the probe pin can be moved to a desired position. However, the methods have had difficulties in that since the probe pins must be moved every time when the connection between every two lands is checked, it takes much time to test a large sized printed circuit board. Moreover, these methods have had a further difficulty in that when an insulation fault is inspected, the capacitance to be detected therefor varies depending on the thickness and quality of the insulating material so that no complete accuracy of analysis of faulty insulation is assured.

To describe concretely the problems involved in the open circuit test on a printed circuit board, we must first of all mention that there are, as parts not matching a grid resolution (e.g., 100 mil. 2.54 mm), a SOP (Small Outline Package), a FPP (Flat Plastic Package), a PLCC (Plastic Leaded Chip Carrier), and a S-DIP (Shrink-Dual Inline Package) shown in FIGS. 8 (*a*), (*b*), (*c*) and (*d*), respectively. These parts are attached to part mounting lands designated by reference numeral 2 in FIGS. 9 (*a*) to (*d*). However, the interval between pins of an electronic part or that between part mounting lands do not in many cases match a 100 mil grid and therefore, in case lands to mount different parts in a CAD system are wired, especially in the case of two channels between grid portions shown in FIG. 10 (wherein the grid portions are defined by blank circles, respectively, and the channels are designated by dotted lines running vertically and horizontally), a wiring pattern 3 is led out up to the cross point of the channels located near each of the lands, a wiring pin 4*a* is arranged at the position where the pattern 3 is led out, and is connected to another wiring pin 4*b* with a wiring pattern 5. Thus, in case a continuity test is conducted by the conventional method on a printed circuit board having wiring pins optionally arranged near the part mounting lands, respectively, it takes much time because, according to the method, all the probe pins must be brought into contact with the lands on the 100 mil grid while the intervals among the lands on the circuit board are not definite. This is especially so when the circuit board is large-sized.

SUMMARY OF THE INVENTION

An object of the present invention is to provide a printed circuit board wiring method which is capable of performing various kinds of tests in a short time on a printed circuit board having electronic parts mounted thereon with the interval between the adjoining pins of the parts unmatched to a predetermined grid resolution.

Conventionally, the open circuit test on a printed circuit board has been conducted by testing every pin simultaneously by using probe pins. However, the present inventors have observed that a sufficient result can be obtained by arranging wiring pins at intervals proportional to the grid resolution and then testing them only. In this case, each of the interval must be a multiple of the minimum grid resolution by an integer constant. Therefore, according to the present invention, when pins of electronic parts are electrically connected to one another to form a net (i.e., an aggregation of pins of electronic parts to be electrically connected to one another), wiring pins are arranged near the pins of the electronic parts, respectively, at such positions within a grid that are identical relative channel positions with one another, each lying within a unit grid portion located in the vicinity of each of the pins of the electronic parts. The pins of the electronic parts are electrically connected to one another through these wiring pins by wiring patterns. At least one insulation checking land is provided within a net using another channel adjacent the channel pattern at the same relative channel position as the wiring pins.

According to the present invention, it is possible to provide a printed circuit board wiring method capable of performing a continuity test for a short time as compared to the conventional wiring method in which the wiring pins are optionally led out to a desired grid resolution. Further, it is possible with the present invention to conduct an insulation test by the same procedures as the continuity test so that there is no fear of lowering the test accuracy with respect to the thickness and quality of an insulating material as compared to the conventional method based on the detection of capacitance.

DETAILED DESCRIPTION OF PREFERRED EMBODIMENT

One embodiment of the present invention will now be described with reference to the accompanying drawings.

Figure 1:
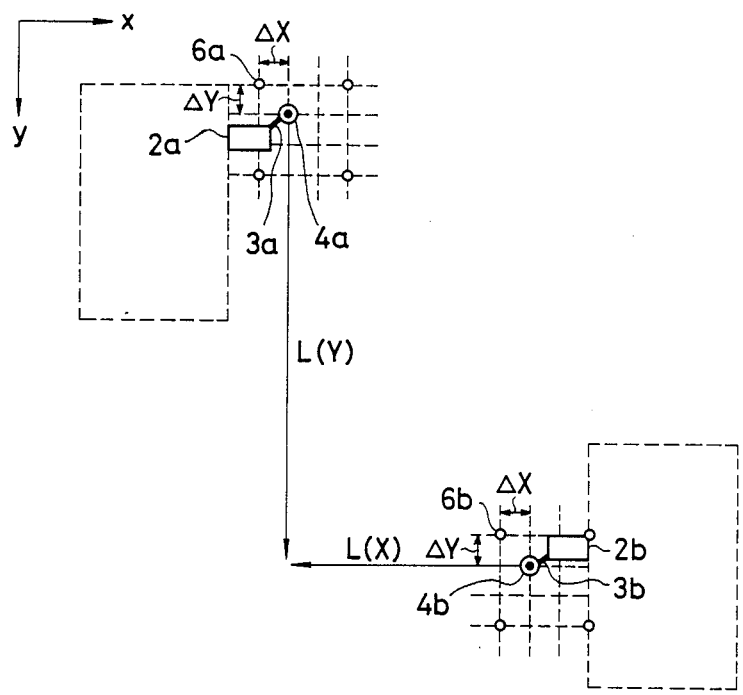
FIG. 1 is a view illustrating a wiring pin according to the present invention.

To begin with, the manner of using wiring pins for an open circuit test and the wiring of the pins will be described with reference to FIGS. 1, 2, and 3. In FIG. 1, reference numerals 2a and 2b designate electronic part mounting lands, reference numerals 3a and 3b designate wiring patterns to connect the lands 2a and 2b to wiring pins 4a and 4b, respectively. When the part mounting lands 2a and 2b belong to the same net (an aggregation of pins of electronic parts to be electrically connected to one another), the wiring pins 4a and 4b are arranged at the cross points of wiring channels (shown by dotted lines running vertically and horizontally), respectively, at which displacements ΔX and ΔY from a point 6a or 6b (where X- and Y-coordinates are the minimum within a 100 mil grid portion defined by four blank circles) are the same. When the coordinates of two wiring pins 4a and 4b are (X₀ and Y₀) and (X₁ and Y₁), respectively, the interval between the pins 4a and 4b will be expressed by the equation:

$$L(X) = |X_1 - X_0|$$

$$L(Y) = |Y_1 - Y_0|$$

Hence, $$L(X) = 100 \text{ mils} \times m \ (m=1, 2, \ldots)$$

$$L(Y) = 100 \text{ mils} \times n \ (n=1, 2, \ldots)$$

will result with each of the values of L(X) and L(Y) being a multiple of 100 mils by an integer constant. The term "Net" herein means an aggregation of pins of electronic parts electrically connected to one another by a desired wiring pattern.

Figure 2:
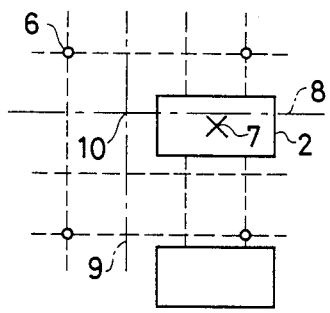
FIGS. 2 and 3 are views illustrating algorithms, respectively, for determining a wiring pin lead out position according to the present invention.
Figure 3:
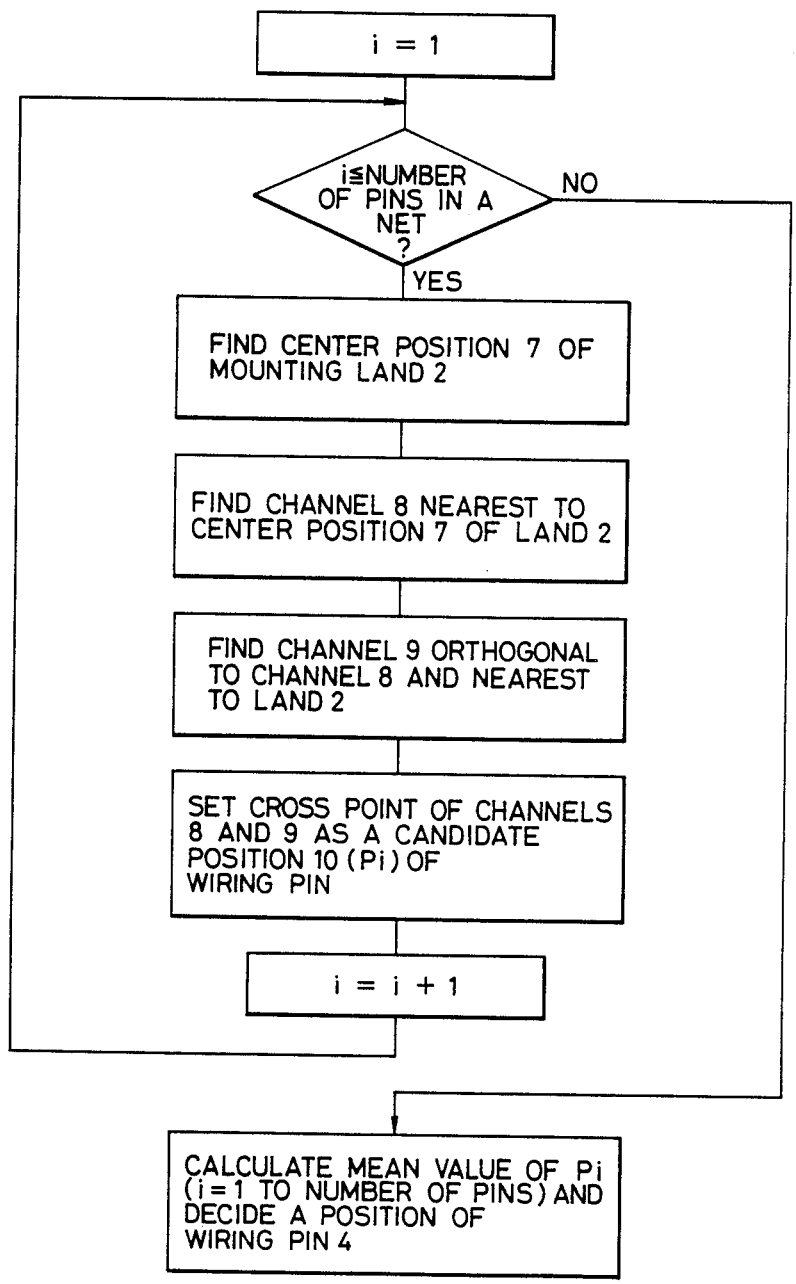

The positioning of the wiring pins is performed by an electronic computer and an algorithm and a flow chart therefor are shown in FIGS. 2 and 3, respectively. In FIG. 2, in order to make the length of the lead out wiring patterns 3a, 3b, . . . as short as possible with respect to the entire net, the center 7 of each of all the part mounting lands within the net is obtained.

Then channels 8 and 9 are selected with respect to each mounting land 2 and a cross point 10 of the channels which is nearest to the land and does not overlap the land is obtained so that it becomes a candidate position of each wiring pin. After that, the relative position of a channel for positioning the wiring pins 4a, 4b, . . . is determined by averaging the coordinates of a plurality of cross points like the point 10 with respect to the remaining lands and each of the mounting lands 2a, 2b, . . . and each of the pins 4a, 4b, . . . is connected through each of the wiring patterns 3a, 3b, . . . .

The connection between the wiring pins 4a and 4b is performed by hand using the conventional CAD system or by an automatic wiring system.

Figure 4:
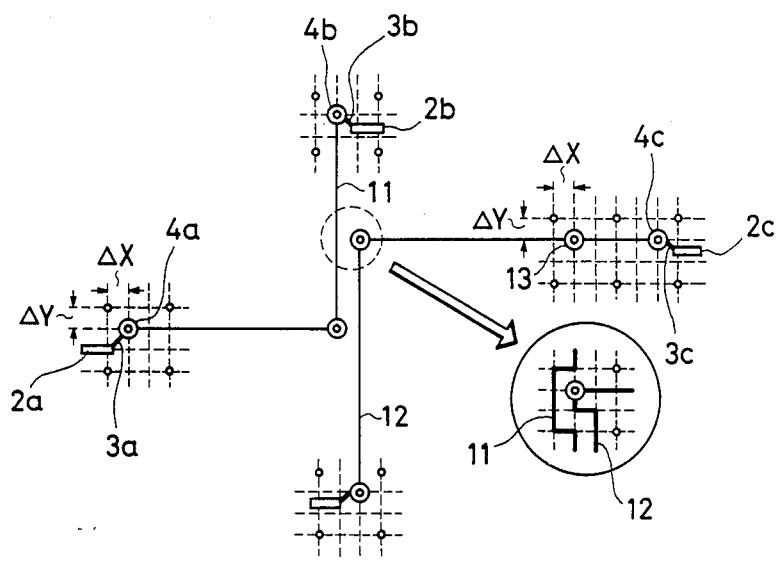
FIG. 4 is a view illustrating a method of setting a land for an insulation test according to the present invention.

Next, a method of forming a land for use in performing an insulation test on a wiring pattern or channel will be described by referring to FIG. 4.

For the test, a wiring pattern adjacent that which is to be tested is used. For example, in case a wiring pattern 12 adjacent a wiring pattern 11 to be tested is used, an inspection is made as to whether or not the pattern 12 includes a portion using a relative channel position same as the wiring pin position (ΔX and ΔY) in the net to which the wiring pattern 11 belongs and if that portion exists, then a land 13 for detecting an insulation fault is provided at that portion. On the other hand, if no such portion exists, the land already existing in the net relating to the pattern 12 is moved. For example, as shown in an enlarged portion of FIG. 4, the land relating to the pattern 12 is moved to the left by one channel space so that the land assumes a position same as the relative position of the wiring pattern 11. In this case, should the land be shortcircuited with the wiring pattern 11, the wiring pattern 11 is so re-wired that it does not come into contact with the wiring pattern 12.

Thus, in the case of a net using a channel at a position adjacent to another channel, at least more than one land is provided at the same relative channel position so as to check whether or not there is any insulation fault.

Figure 5:
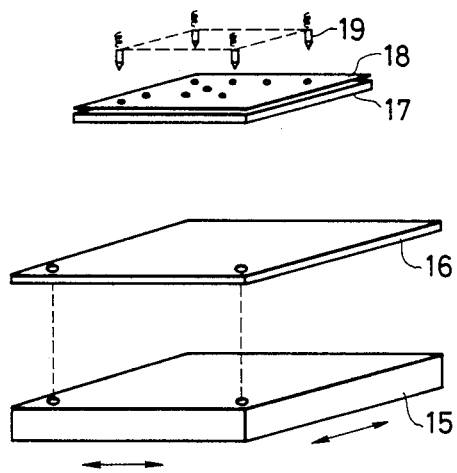
FIG. 5 is a diagram of a structure of a tester.

Next, various test methods on a printed circuit board designed with a wiring pattern according to the present invention will be described. In FIG. 5, a printed circuit board 17 to be tested is fixed to a test station 15 together with a masking diaphragm 18 for causing test pins 19 to come into contact with only a required portion of the printed circuit board and a positioning template 16. The test station 15 is made movable so that the test pins 19 can get access to a desired relative channel position.

Figure 6:
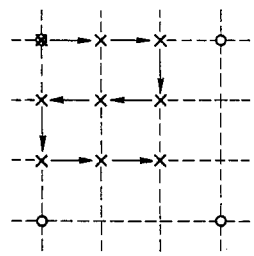
FIG. 6 is a view illustrating a manner of transfer of the tester shown in FIG. 5.
Figure 7:
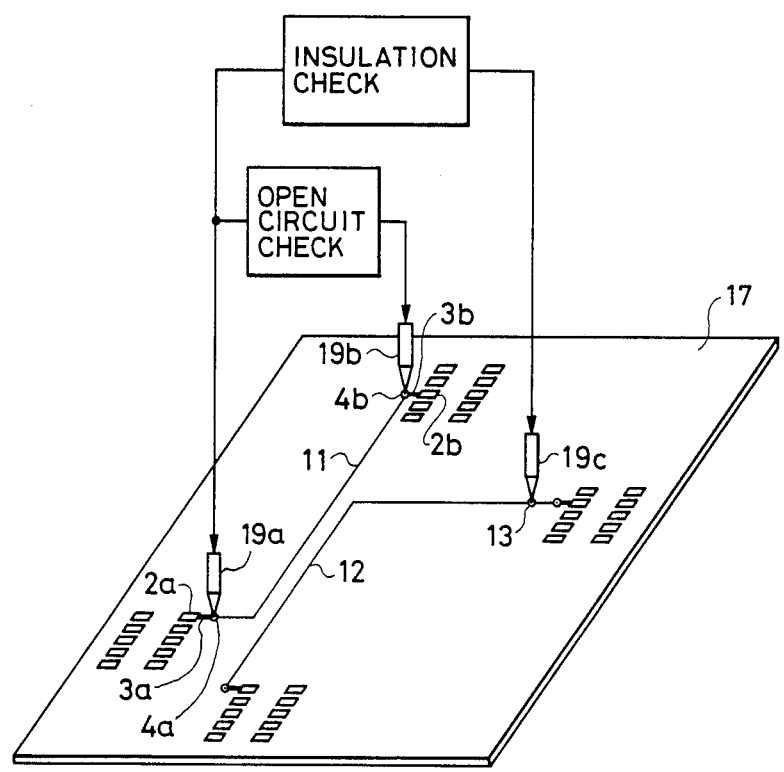
FIG. 7 is a view illustrating an open circuit and an insulation test.
Figures 8A, 8B, 8C, 8D:
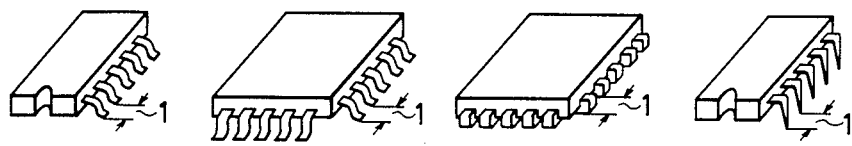
FIGS. 8 (a), (b), (c) and (d) are perspective views of mounted parts, respectively.
Figures 9A, 9B, 9C, 9D:
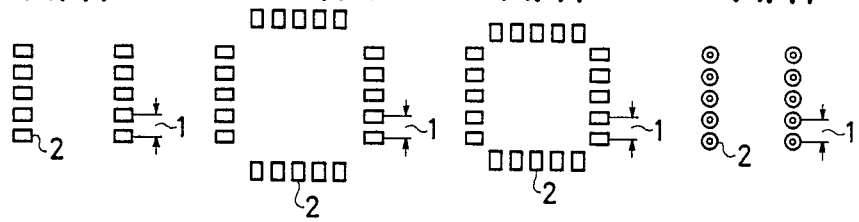
FIGS. 9 (a), (b), (c) and (d) are pin arrangement charts, respectively.
Figure 10:
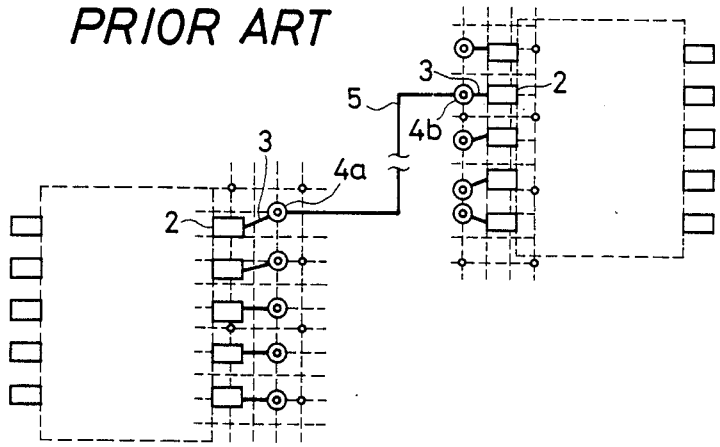
FIG. 10 is an illustrative view of a conventional wiring method.

With the above arrangement, the test station 15 is moved to align with X-positions in FIG. 6. Then, an open circuit test and an insulation test are conducted in the manner shown in FIG. 7. That is:

(a) Open Circuit Test . . . To bring the probe pins 19a and 19b into contact with the wiring pins 4a and 4b in the same net.

(b) Insulation Test . . . When, after the wiring pattern 11 has passed the above-mentioned open circuit test, the insulation between the wiring pattern 11 and a wiring pattern 12 using a channel adjacent to the wiring pattern 11 is tested, to cause the probe pins 19a and 19c to contact the wiring pin 4a connected to the wiring pattern 11 and the insulation testing land 13.

The above open circuit and insulation tests are conducted on all the nets having wiring pins on the same relative position channel.

What is claimed is:

1. A method of wiring electronic parts on a printed circuit board, the electronic parts having pins, the pins to be electrically connected to one another to thereby form a net, the printed circuit board having wiring channels, the wiring channels having a predetermined grid resolution, the pins being arranged at intervals unmatched to the predetermined grid resolution, the printed circuit board having electronic part mounting lands, corresponding to the pins of the electronic parts, through which electronic part mounting lands desired pins of the electronic parts are electrically connected to the wiring channels, said method comprising the steps of providing wiring pins on the printed circuit board at wiring channel positions that are the same, relative to unit grid portions as determined by the predetermined grid resolution of the wiring channels, the wiring pins being provided at an interval that is a multiple, by an integer constant, of the predetermined grid resolution, each of the unit grid portions being located in the vicinity of respective electronic part mounting land respectively to be connected with respective pins, of the electronic part, that form the net; and electrically connecting said pins of the electronic parts forming the net to one another by a wiring pattern, including the wiring channels, through said electronic part mounting land and the wiring pins.

2. A method of wiring electronic parts according to claim 1, wherein said wiring channels are constituted by a plurality of wiring channels that intersect so as to form said unit grid portions, and wherein said step of providing wiring pins on the printed circuit board at wiring channel positions includes providing wiring pins at intersections of the plurality of wiring channels in the vicinity of the respective electronic part mounting lands, whereby said intersections, at which the wiring pins are provided, are at the same positions, relative to the unit grid portions as determined by the predetermined grid portions, said intersections being at an interval that is a multiple, by an integer constant, of the predetermined grid resolution.

3. A method of wiring electronic parts according to claim 2, wherein the plurality of wiring channels includes wiring channels orthogonal to each other so as to form said intersections, and wherein the intersections at which the respective wiring pins are provided are the intersections of wiring channels that are closest to the respective electronic part mounting lands.

4. A method of wiring electronic parts on a printed circuit board, the electronic parts having pins, the pins to be electrically connected to one another to thereby form a net, the printed circuit board having wiring channels, the wiring channels having a predetermined grid resolution, the pins being arranged at intervals unmatched to the predetermined grid resolution, the printed circuit board having electronic part mounting lands, corresponding to the pins of the electronic parts, through which electronic part mounting lands desired pins of the electronic parts are electrically connected to the wiring channels, said method comprising the steps of providing wiring pins on the printed circuit board at wiring channel positions that are the same, relative to unit grid portions as determined by the predetermined grid resolution of the wiring channels, each of the unit grid portions being located in the vicinity of respective electronic part mounting land respectively to be connected with respective pins, of the electronic part, that form the net; electrically connecting said pins of the electronic parts forming the net to one another by a wiring pattern, including the wiring channels, through said electronic part mounting land and the wiring pins; and providing an insulation checking land at said wiring channel portions that are the same, relative to unit grid portions as determined by the predetermined grid resolution of the wiring channels, in order to check the insulation between said one wiring pattern and another wiring pattern.

* * * * *